United States Patent [19]
Fujimoto

[11] Patent Number: 5,413,673
[45] Date of Patent: May 9, 1995

[54] PLASMA PROCESSING APPARATUS
[75] Inventor: Hideki Fujimoto, Fuchu, Japan
[73] Assignee: Anelva Corporation, Tokyo, Japan
[21] Appl. No.: 785,256
[22] Filed: Nov. 4, 1991

Related U.S. Application Data
[63] Continuation of Ser. No. 555,362, Jul. 18, 1990, abandoned, which is a continuation of Ser. No. 910,575, Sep. 23, 1986, abandoned.

[30] Foreign Application Priority Data
Sep. 24, 1985 [JP] Japan .................. 60-208751

[51] Int. Cl.$^6$ .............................. C23F 1/02
[52] U.S. Cl. .................. 156/345; 204/298.31
[58] Field of Search ............ 156/345; 204/192.1, 204/192.12, 192.32, 192.35, 192.36, 192.37, 192.31, 192.33, 192.34, 298.31, 298.39

[56] References Cited

U.S. PATENT DOCUMENTS

| | | | |
|---|---|---|---|
| 4,131,533 | 12/1978 | Bialks et al. | 204/298 |
| 4,253,907 | 3/1981 | Parry et al. | 204/298 X |
| 4,367,114 | 1/1983 | Steinberg et al. | 204/298 X |
| 4,380,488 | 4/1983 | Reichelderfer et al. | 156/345 X |
| 4,482,419 | 11/1984 | Tsukada et al. | 204/298 X |
| 4,496,423 | 1/1985 | Walton | 204/298 X |
| 4,614,639 | 9/1986 | Hegedus | 156/345 X |

FOREIGN PATENT DOCUMENTS
59-47732  3/1984  Japan .
60-12735  1/1985  Japan .

*Primary Examiner*—Nam Nguyen
*Attorney, Agent, or Firm*—Pollock, Vande Sande & Priddy

[57] ABSTRACT

In a plasma etching apparatus, a workpiece is mounted on a lower electrode positioned opposite to an upper electrode, a ring-shaped spacer made of a dielectric material is provided on the outer peripheral portion of the lower electrode. When the RF power is supplied between the upper and lower electrodes, the plasma is generated only in a region defined by the upper and lower electrodes surrounded by the dielectric spacer.

11 Claims, 4 Drawing Sheets

FIG_3
PRIOR ART

FIG_5B
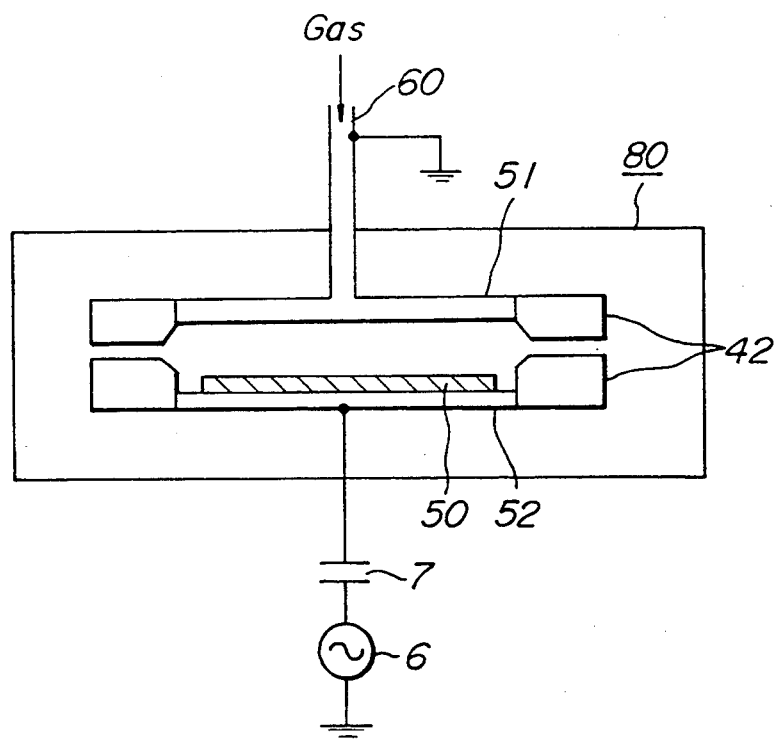
FIG_5C
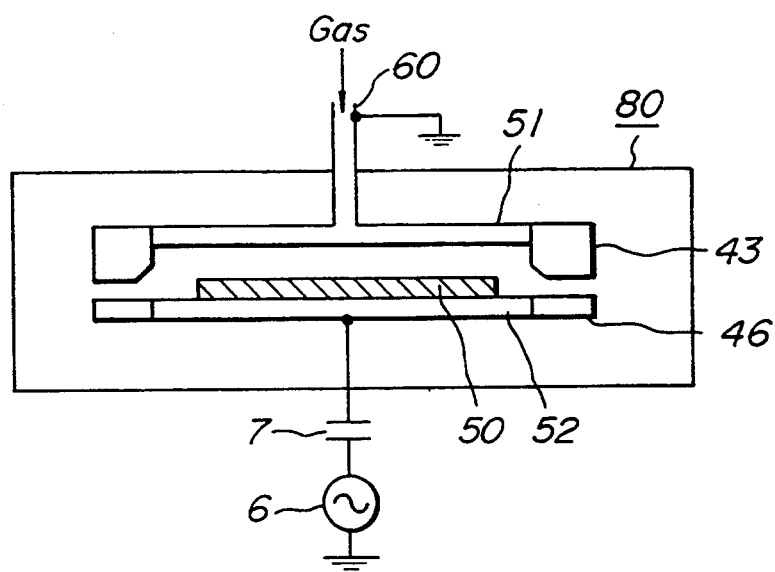

PLASMA PROCESSING APPARATUS

This application is a continuation of Ser. No. 555,362, filed on Jul. 18, 1990, abandoned which is a continuation of Ser. No. 910,575 filed Sep. 23, 1986 now abandoned.

BACKGROUND OF THE INVENTION

1. Field of the Invention

The present invention relates to a plasma processing apparatus, and more particularly to a plasma processing apparatus in which one electrode is positioned opposite to the other electrode and a dielectric member having a specifically-defined width is mounted on either electrode, so as to define a region for preventing divergence of the produced plasma.

2. Description of the Prior Art

In one of the conventional plasma processing apparatus 20, a pair of electrodes 1 and 2, as shown in FIG. 1, are positioned opposite to each other; and an object, or workpiece 5, to be plasma-processed, is mounted on either electrode 1 or 2. When the workpiece 5 is subjected to the high-rate etching in this plasma processing apparatus 20, an interval or distance 3 between the electrodes 1 and 2 must be narrowed. Also the pressure of the gas introduced into a plasma processing chamber 8 must be set to be high. One electrode 1 is grounded, whereas the other electrode 2 is coupled to an RF (radio frequency) power supply 6. In this case, the weak plasma appears outside the region defined by the electrodes 1 and 2, so that the plasma produced does not concentrate only on an object, or workpiece to be plasma-processed 5 mounted on the electrode 2. There is a problem with this conventional processing apparatus although sufficient power is supplied via a capacitor 7 from the RF power supply 6, the etching process rate cannot be improved beyond the etching process rate realized by the sufficient power. Another problem is that the etching process rate at the center of the workpiece 5 is different from that at the peripheral portion thereof, resulting in an unbalanced etching process condition.

As shown in FIG. 2, another conventional plasma etching apparatus has the following drawbacks. In this apparatus, both outer edges of the electrodes 1 and 2 are in contact with wall portions 10 of a processing chamber. At least the wall portions 10 located between the electrodes 1 and 2 are subjected to the plasma bombardment. Accordingly, the substance sputtered from these plasma-bombarded wall portions 10 functions as a contamination source. When the wall portions 10 are made of fluorine-contained polymers, e.g., polytetrafluorinatedethylene (PTFE), fluorine atoms are emitted therefrom. Under this condition, if the silicon compound is plasma-etched, the etching rate at the center of the workpiece 5 would differ from the peripheral portion thereof. That is to say, unbalance etching rate may be provided. Moreover, when the observation window is formed for observing the plasma conditions, or a hole onto which a detection device is mounted is made for detecting the plasma processing conditions, then the plasma conditions are changed. In addition, the substance emitted from the window or hole which is different from the wall's substance, is locally sputtered, so that the distribution of the film quality over the substrate is varied, i.e., poor uniformity of film quality.

In FIG. 3, another prior art etching processing apparatus employs a rectangular electrode covering member 11. The employment of the electrode covering member 11 enables the electric field to be concentrated on the workpiece 5. Further, the uniformity of the etching rate can be improved by selecting proper materials for this electrode covering member 11 so as to produce a gas sputtered from the electrode covering member 11. However, power leaks through the electrode covering member 11 mounted on the electrode 2, so that the plasma etching processing rate cannot be improved even if a great amount of power is supplied from the RF power supply 6. Due to the power leakage, the substance sputtered from the electrode covering member 11 greatly and adversely influences the film quantity, particularly in the higher etching rate. In other words, the etching rate and the uniformity of the film quantity can hardly be controlled. In this drawing, reference numeral 9 shows a gas pipe.

The above-described prior art etching apparatus are disclosed in, for example, "Reactive Ion Etching", VLSI Electronics, B. Gorwitz and R. J. Saia, vol. 8, 1984 by Academic Press INC, and Japanese patent unexamined application No. 57-185982(1984).

An object of the invention is to solve the above-described conventional drawbacks, and therefore to provide a plasma processing apparatus wherein an object to be processed is mounted on an electrode, the length of which is substantially the same as that of the object, and a dielectric material is fixed on the peripheral portion of either electrode so as to establish a narrower interval than the interval between the opposite electrodes thereby preventing the plasma from being dispersed away from the region where the plasma is produced and realizing more efficient and uniform high-rate-plasma etching.

SUMMARY OF THE INVENTION

The above and other objects of the invention are achieved by providing a plasma processing apparatus wherein a gas is conducted between a pair of electrodes positioned opposite to each other, and an RF (radio frequency) power supply is supplied to said pair of opposite electrodes so as to generate plasma for processing an object to be plasma-processed positioned on one of said electrodes, characterized in that:

- a dielectric material is provided on at least one outer peripheral portion of said electrodes; and
- a spacer member is arranged in such a manner that a first interval between said dielectric member and the other electrode is selected to be shorter than a second interval between the opposite electrodes by approximately 70%, thereby preventing the plasma from being dispersed from a region where it was generated.

BRIEF DESCRIPTION OF THE DRAWINGS

The above purpose and other useful features of the present invention will become more readily apparent in the following description of the accompanying drawings, in which:

FIGS. 5A to 5C are schematic diagrams of the plasma processing apparatus according to the first to the third preferred embodiments of the invention.

DESCRIPTION OF PREFERRED EMBODIMENT

Before proceeding with the various preferred embodiments, a basic idea of the invention will now be summarized.

Figure 4:
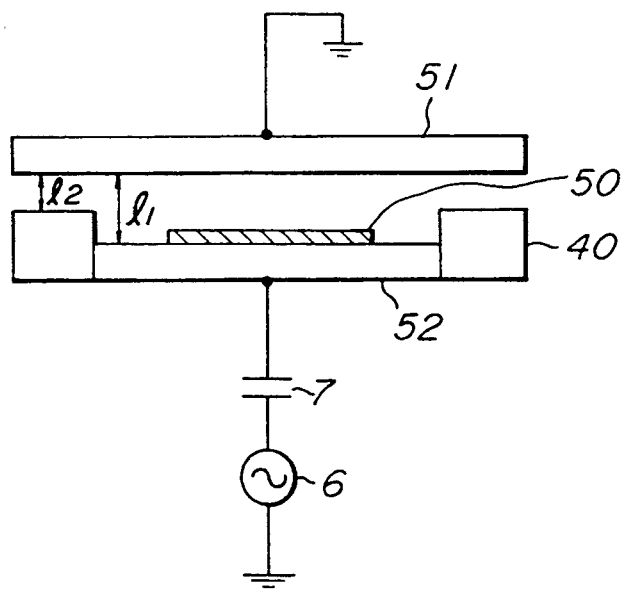
FIG. 4 is a schematic diagram showing a basic idea of the plasma processing apparatus according to the invention.

FIG. 4 illustrates a basic arrangement of the plasma processing apparatus according to the invention. This arrangement is constituted by electrodes 51 and 52, a spacer 40, an object or workpiece to be processed 50, and an RF (radio frequency) power supply 6.

As seen from FIG. 4, the spacer 40 made of a dielectric material is provided on the peripheral portion of the lower electrode 52. A distance, or interval between the upper electrode 51 and the lower electrode 52, is selected to be "$l_1$", whereas a distance, or interval between the upper electrode 51 and the top surface of the spacer 40, is selected to be "$l_2$". The latter interval "$l_2$" is shorter than the former interval "$l_1$". The workpiece 50 is positioned on the lower electrode 52. Thus, the distance separating electrodes 51 and the top surface of spacer 40 is less than the distance separating electrodes 51 and 52, so that, as is clearly shown in FIG. 4, workpiece 50 is surrounded by spacer 40. Similarly, a predetermined reactive gas is conducted into a region defined by the electrodes 51 and 52 under a preselected gas pressure, and the RF power is supplied via a capacitor 7 from the RF power supply 6 to the upper and lower electrodes 51 and 52.

Then, the electric discharge occurs between the upper and lower electrodes 51 and 52, resulting in the plasma discharge. In this arrangement of FIG. 4, as the discharge impedance between the upper electrode 51 and the dielectric spacer 40 is greater than the discharge impedance between the upper and lower electrodes 51 and 52, the discharge is substantially blocked in the region defined by the top of the spacer 40 and the upper electrode 51. That is to say, the dielectric constant of the region between the upper and lower electrodes 51 and 52 is smaller than that of the region between the dielectric spacer 40 and the upper electrode 51. As a result, uniform discharge occurs on a surface of the lower electrode 52 surrounded by the spacer 40, and therefore the uniform plasma processing can be attained at a higher rate, as well as with higher efficiency. It is found that the shorter distance "$l_2$" between the dielectric spacer 40 and the electrode 51 is designed to be shorter than approximately 70% of the other distance "$l_1$" and the dielectric constant $\epsilon$ of the dielectric material may be varied from approximately 2 to 10 in order to achieve better processing results. When the fluorine gas is employed and the interval "$l_2$" is shorter than 70% of the interval "$l_1$" the stable discharge can be produced in the inside region between the upper and lower electrodes surrounded by the spacer 40 independent of the vacuum condition, supplied power and flow rate. Moreover, since the plasma produced is not entered onto the dielectric spacer 40, the dielectric spacer 40 is not subjected to the sputtering process. Accordingly, no adverse influence is given to the plasma processing of the workpiece 50, so that the etching rate and the etching process uniformity can be easily controlled.

Figure 5A:
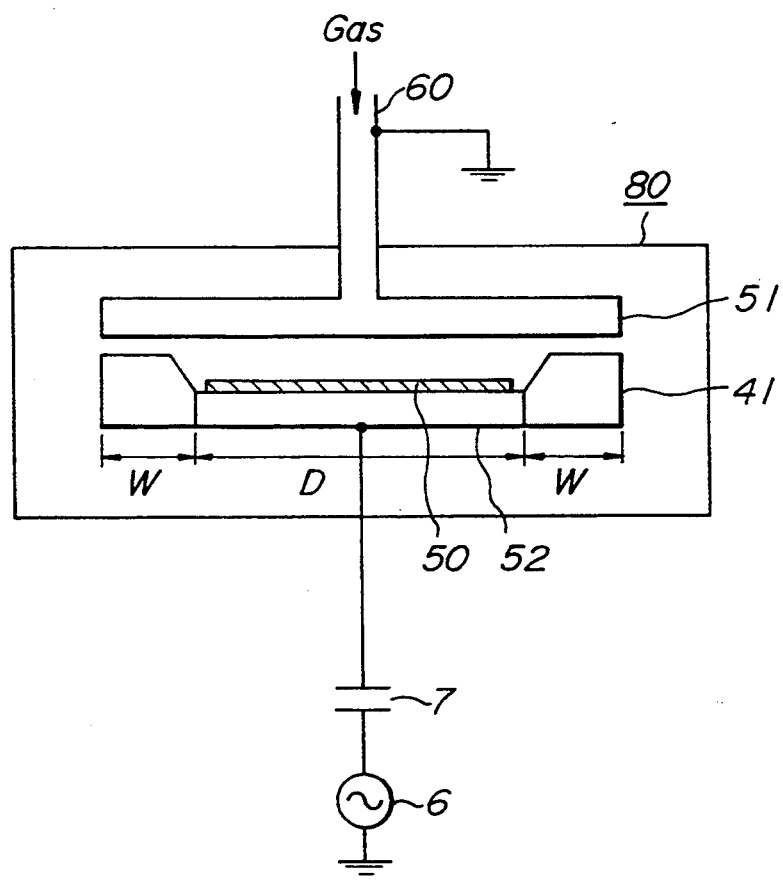

Referring now to FIGS. 5A to 5C, a description will be made of typical plasma processing apparatus according to preferred embodiments. Briefly stated, a dielectric spacer 41 is provided around the peripheral portions of the lower electrode 52 to which the RF power is supplied from the RF power supply 6 in the first apparatus shown in FIG. 5A.

In the second apparatus as shown in FIG. 5B, dielectric spacers 42 are provided on both the upper electrode 1 connected to the ground and the lower electrode 52 to which the RF power is supplied.

In the second apparatus shown in FIG. 5C, a dielectric spacer 43 is provided on the upper electrode 51 grounded, whereas a dielectric material 46 is provided on the lower electrode 52 to which the RF power is supplied.

In the FIGS. 5A to 5C, reference numeral 60 indicates a gas pipe, reference numeral 80 denotes a processing chamber, and the common components are represented by the same reference numerals among these figures.

In the first preferred embodiment shown in FIG. 5A, a desirable reactive gas is conducted through the gas pipe 60 into the region defined by both the upper and lower electrodes 51 and 52. Then, the RF power is supplied from the RF power supply 6 via the capacitor 7 to the upper and lower electrodes 51 and 52. The plasma is generated between the upper and lower electrodes 51 and 52, so that the workpiece 50 positioned on the lower electrode 52 is plasma-processed, e.g., plasma-etched. In this processing apparatus, such plasma etching can be performed at a higher rate under the following conditions the interval between the upper and lower electrodes 51 and 52 is selected to be from approximately 4 to 10 mm, the gas pressure is set to approximately 0.5 to 3 Torrs, and the density of the RF power is selected to be approximately 1 to 3 W/cm$^2$.

Figure 1:
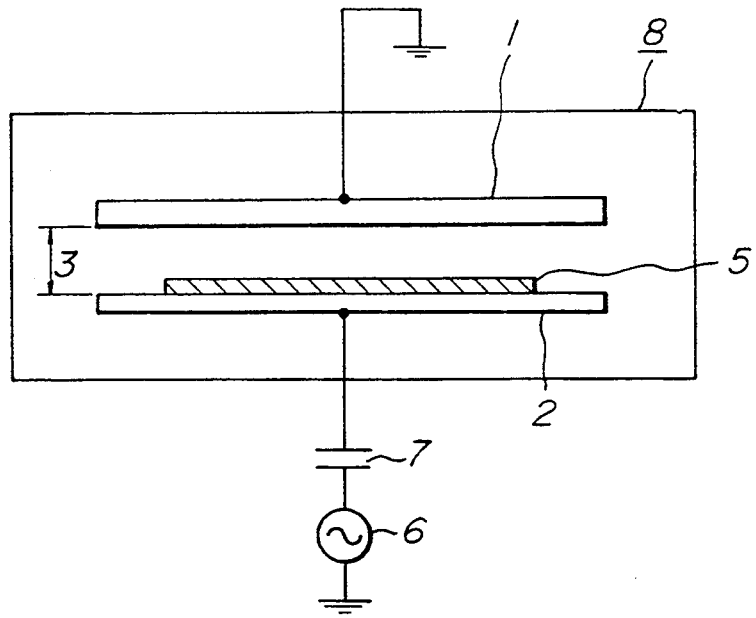
FIGS. 1 to 3 are schematic diagrams of the typical prior art plasma etching apparatus.

It should be noted that in the conventional processing apparatus shown in FIG. 1, the interval between the upper and lower electrodes 1 and 2 is kept constant from the center portions of these electrodes to the peripheral portions thereof and another space or region is made between the peripheral portion and the processing chamber 8. Accordingly, the plasma is dispersed from the main space between the electrodes 1 and 2 toward another space. In other words, the plasma is not concentrated within the main space defined by the upper and lower electrodes 1 and 2, with the result that the etching rate is not increased even if the RF power is increased; also the uniformity of the etching conditions 14 is deteriorated.

To the contrary, the spacer 41 of the invention is formed at the outer peripherals of the lower electrode 52 so as to concentrate the plasma onto the inner portion or space of the lower electrode 52 surrounded by the spacer 41. When the interval between the upper and lower electrodes 51 and 52 was selected to be 7 mm and the interval between the lower electrode 52 and the spacer 41 made of fluorine-contained polymers or alumina was determined as approximately 4.5 mm, the plasma produced could be concentrated onto the inside portion or space of the lower electrode 52 surrounded by the spacer 41. The optimum interval between the spacer 41 and the upper electrode 51 is varied within a small range by changing the sort of gas, the gas pressure and the RF power. This interval is preferably selected to be approximately 70% of the interval between the upper and lower electrodes 51 and 52, or smaller than 70%. As a result, the workpiece 50 mounted on the lower electrode 52 can be plasma-processed uniformly at the higher rate. Precisely speaking, the width W of the spacer 41 is selected to be approximately more than 1/15 of a diameter "D" of the lower electrode 52.

FIG. 5B shows a second preferred embodiment. In this case, ring-shaped spacers 42 are mounted on both the upper and lower electrodes 51 and 52. As a result, the same effect as in the first preferred embodiment can be achieved.

FIG. 5C illustrates a plasma processing apparatus according to a third preferred embodiment. In this apparatus, a ring-shaped spacer 43 is mounted on the upper electrode 51 connected to the ground. When such a ring-shaped spacer is provided on the grounded electrode, a region transversely surrounded by the upper and lower electrodes 51 and 52 becomes small. In the specific electrode arrangement, substantially no region surrounded by the upper and lower electrodes 51 and 52 is made. Consequently, the lower electrode 52 to which the RF power is supplied from the RF power supply 6 must be surrounded by a dielectric member 46 having a sufficient thickness.

Figure 2:
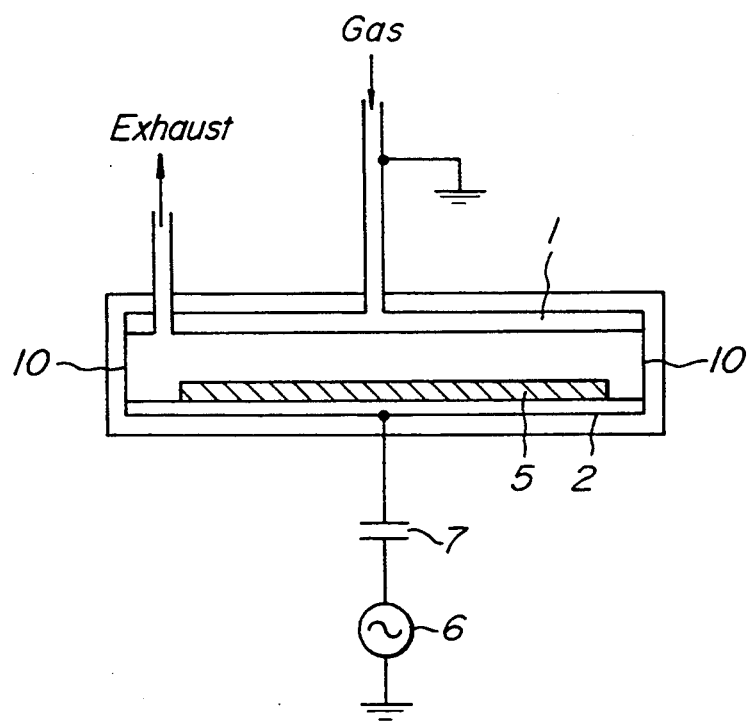
Figure 3:
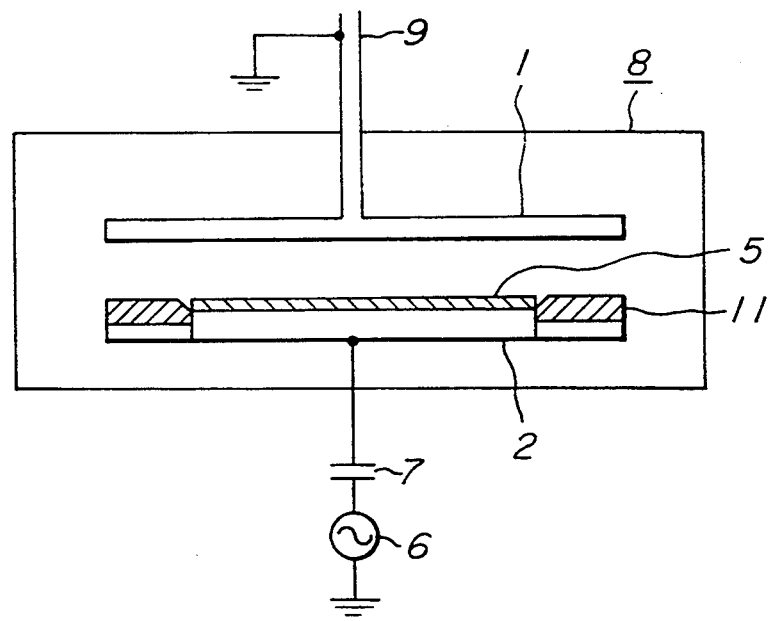

Since the spacer 43 and the dielectric member 46 are mounted in a ring shape around the outer peripheral portions of the upper and lower electrodes 51 and 52 respectively, the inside wall of the processing chamber 80 is only partially subjected to the plasma bombardment, which is completely different from the conventional wall portion 10 of the reaction chamber shown in FIG. 2. Moreover, as the inside wall of the processing chamber 80 is located outside the spacer 43, even if a window for detecting the plasma conditions is formed thereon, no adverse influence is given to the plasma condition over the workpiece 5.

As previously described in detail, a pair of opposite electrodes is provided and a dielectric member having an interval narrower than the interval between the opposite electrodes is provided on an outer peripheral portion of at least one electrode according to the invention. Accordingly, with the above arrangement, the region where the plasma occurs is not spread out and the plasma produced is concentrated onto the region between the electrodes, so that a workpiece can be uniformly plasma-processed at a high rate and with an optimum efficiency.

What is claimed is:

1. A plasma processing apparatus, comprising:
   a chamber;
   a pair of opposed electrodes each isolated from internal surfaces of said chamber being spaced in parallel from each other along respective horizontal planes, opposed surfaces of said electrodes being separated by a distance transverse to said horizontal planes of said electrodes, a first discharge impedance being effected between the opposed surfaces of said electrodes;
   means for introducing a reactive gas between said electrodes;
   means for applying energy across said electrodes to generate plasma from said gas to etch at least one to be processed substrate arranged on the opposed surface of one of said electrodes;
   a dielectric spacer member contiguously provided at the outer peripheral portion of one of said electrodes to effect, with said one of said electrodes, a combined opposed surface area having the same size as the area of the opposed surface of the other of said pair of electrodes, said dielectric spacer having an opposed surface extending from the plane of the opposed surface of said one of said electrodes toward the opposed surface of said other of said electrodes to effectively form a first zone defined by the space transversely between the opposed surfaces of said one and other electrodes and a second zone defined by the space transversely between the opposed surface of said other electrode and the opposed surface of said spacer member, another transverse distance separating the opposed surfaces of said other electrode and said spacer member being less than said transverse distance between the opposed surfaces of said one and other electrodes so as to surround said at least one to be processed substrate by said spacer member, said another transverse distance being less than or equal to approximately 2.5 mm, a second discharge impedance being effected between said other electrode and said spacer member in said second zone, the difference between said first and second discharge impedances effectively and substantially confining said plasma in said first zone to etch said substrate.

2. The apparatus of claim 1, wherein said another transverse distance is at least 70% less than said transverse distance between the opposed surfaces of said one and other electrodes.

3. The apparatus of claim 1, wherein the combined opposed surface area of said dielectric member and said one of said pair of electrodes is aligned transversely with the area of the opposed surface of said other of said pair of electrodes.

4. A plasma processing apparatus, comprising:
   a chamber;
   a pair of opposed electrodes each isolated from internal surfaces of said chamber being spaced in parallel from each other along respective horizontal planes, opposed surfaces of said electrodes being separated by a distance transverse to said horizontal planes of said electrodes, a first discharge impedance being effected between the opposed surfaces of said electrodes;
   means for introducing a reactive gas between said electrodes;
   means for applying energy across said electrodes to generate plasma from said gas to etch at least one to be processed substrate arranged on the opposed surface of one of said electrodes;
   a pair of opposed dielectric spacer members each contiguously provided at the outer peripheral portion of a corresponding one of said electrodes, said dielectric spacer members extending toward each other and separated from respective opposed surfaces thereof by another distance transverse to said horizontal planes of said electrodes, said another transverse distance being less than said transverse distance separating said electrodes, said another transverse distance being less than or equal to approximately 2.5 mm, said pair of dielectric spacer members effectively forming a first zone defined by the space transversely between the opposed surfaces of said pair of opposed electrodes and a second zone defined by the space transversely between the opposed surfaces of said dielectric spacer members, a second discharge impedance being effected between said pair of spacer members in said second zone, the difference between said first and second discharge impedances effectively and substantially confining said plasma in said first zone to etch said substrate.

5. The apparatus of claim 4, wherein the opposed surfaces of said pair of electrodes each has substantially the same surface area as the other opposed surface; and wherein the opposed surfaces of said opposed dielectric spacer members each has substantially the same surface area as the other opposed surface.

6. The apparatus of claim 4, wherein each corresponding one of said electrodes and its contiguous spacer member have the same combined opposed surface area as the other corresponding one of said electrodes and its contiguous spacer member, said respective combined opposed surface areas being aligned transversely to said horizontal planes.

7. The apparatus of claim 4, wherein said another transverse distance is at least 70% less than said transverse distance between the opposed surfaces of said pair of opposed electrodes.

8. A plasma processing apparatus, comprising:
a chamber;
a pair of opposed electrodes each isolated from internal surfaces of said chamber being spaced in parallel from each other along respective horizontal planes, opposed surfaces of said electrodes being separated by a distance transverse to said horizontal planes of said electrodes, a first discharge impedance being effected between the opposed surfaces of said electrodes;
means for introducing a reactive gas between said electrodes;
means for applying energy across said electrodes to generate plasma from said gas to etch at least one to be processed substrate arranged on the opposed surface of one of said electrodes;
a pair of opposed dielectric spacer members each contiguously provided at the outer peripheral portion of a corresponding one of said electrodes, one of said spacer members extending from the plane of the opposed surface of its corresponding one of said electrodes toward the other spacer member to effect, via respective opposed surfaces of said pair of spacer members, another distance transverse to said horizontal planes of said electrodes and to effectively form a first zone defined by the space transversely between the opposed surfaces of said pair of electrodes and a second zone defined by the space transversely between the opposed surfaces of said spacer members, said another transverse distance separating the opposed surfaces of said opposed spacer members being less than said transverse distance between the opposed surfaces of said pair of electrodes, said another transverse distance being less than or equal to approximately 2.5 mm, a second discharge impedance being effected between said spacer members in said second zone, the difference between said first and second discharge impedances effectively and substantially confining said plasma in said first zone to etch said substrate.

9. The apparatus of claim 8, wherein the opposed surfaces of said pair of electrodes each has substantially the same surface area as the other opposed surface; and
wherein the opposed surfaces of said opposed dielectric spacer members each has substantially the same surface area as the other opposed surface.

10. The apparatus of claim 8, wherein the respective opposed surfaces of said electrodes are aligned transversely to said horizontal planes; and
wherein the respective opposed surfaces of said spacer members are likewise aligned transversely to said horizontal planes.

11. The apparatus of claim 8, wherein said another transverse distance is at least 70% less than said transverse distance between the opposed surfaces of said pair of opposed electrodes.

* * * * *